United States Patent
Nakamoto et al.

(10) Patent No.: US 9,000,810 B2
(45) Date of Patent: Apr. 7, 2015

(54) QUANTIZER, COMPARATOR CIRCUIT, AND SEMICONDUCTOR INTEGRATED CIRCUIT

(71) Applicants: Fujitsu Limited, Kawasaki-shi, Kanagawa (JP); Fujitsu Semiconductor Limited, Yokohama-shi, Kanagawa (JP)

(72) Inventors: Hiroyuki Nakamoto, Kawasaki (JP); Hideta Oki, Kawasaki (JP)

(73) Assignees: Fujitsu Limited, Kawasaki (JP); Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/075,763

(22) Filed: Nov. 8, 2013

(65) Prior Publication Data

US 2014/0167824 A1     Jun. 19, 2014

(30) Foreign Application Priority Data

Dec. 18, 2012   (JP) ................. 2012-275540

(51) Int. Cl.
*H03K 3/00* (2006.01)
*H03M 1/12* (2006.01)

(52) U.S. Cl.
CPC ....................................... *H03M 1/12* (2013.01)

(58) Field of Classification Search
USPC ........................................................ 323/283
See application file for complete search history.

(56) References Cited

U.S. PATENT DOCUMENTS

2010/0213911 A1* 8/2010 Oki .............................. 323/283
2011/0210762 A1   9/2011 Hirose et al.

FOREIGN PATENT DOCUMENTS

| JP | 2-2710 A | 1/1990 |
| JP | 5-235744 A | 9/1993 |
| JP | 2011-182188 A | 9/2011 |

OTHER PUBLICATIONS

Isono et al., "A 18.9-nA Standby Current Comparator with Adaptive Bias Current Generator," IEEE Asian Solid-State Circuits Conference, Jeju, Korea, Nov. 14-16, 2011, pp. 237-240.

* cited by examiner

*Primary Examiner* — Daniel Rojas
(74) *Attorney, Agent, or Firm* — Arent Fox LLP

(57) ABSTRACT

A quantizer takes an analog signal as input and produces a quantized signal for output. The quantizer includes a shoot-through current detection unit and a feedback unit. The shoot-through current detection unit is configured to detect a shoot-through current flowing through the quantizer. The feedback unit is configured to feed back a signal from the shoot-through current detection unit and control an electric charge stored at an input of the quantizer.

13 Claims, 13 Drawing Sheets

US 9,000,810 B2

QUANTIZER, COMPARATOR CIRCUIT, AND SEMICONDUCTOR INTEGRATED CIRCUIT

CROSS-REFERENCE TO RELATED APPLICATION

This application is based upon and claims the benefit of priority of the prior Japanese Patent Application No. 2012-275540, filed on Dec. 18, 2012, the entire contents of which are incorporated herein by reference.

FIELD

The embodiments discussed herein are related to a quantizer, a comparator circuit, and a semiconductor integrated circuit.

BACKGROUND

Lithium-ion secondary batteries or the like are now widely used in wireless electronic devices such as mobile phones. Such electronic devices are equipped, for example, with a circuit for generating a power-on reset (POR) signal to indicate whether a sufficient supply voltage is available or not or with a power management IC (semiconductor integrated circuit) for managing it.

The POR signal generating circuit outputs, for example, a high level "H" when a sufficient supply voltage is available, and otherwise outputs a low level "L", and therefore it usually includes a comparator circuit that performs voltage comparisons using a given reference voltage.

In the comparator circuit, the difference between the reference voltage (reference signal) and the divided supply voltage (input signal), for example, is amplified by an analog amplifier and converted into an H/L digital-output signal by a subsequent quantizer. The reference voltage here may be generated within the circuit by using, for example, a bandgap reference or the like.

In the case of a quantizer which includes a CMOS inverter, when an inversion of the POR signal occurs with the voltage level of the input signal becoming higher than or lower than that of the reference signal, the output of the amplifier is driven to an intermediate voltage level, and as a result, a shoot-through current flows through the quantizer.

The shoot-through current of the quantizer does not present any problem, when the duration of the shoot-through current is very short or when the amount of electric charge stored at the power supply is large (the stored power resource is sufficient), however, it may present a problem when the amount of electric charge stored at the power supply is very small.

That is, when the amount of electric charge stored at the power supply is very small, all the stored charges may be used as the shoot-through current that flows at the time of the inversion of the quantizer output, making it difficult to ensure normal operation.

In this regard, various types of comparator circuit capable of performing decision-making operations at high speed with low power consumption have been proposed in the prior art.

Patent Document 1: Japanese Laid-open Patent Publication No. 2011-182188

None-Patent Document 1: K. Isono et al., "A 18.9-nA Standby Current Comparator with Adaptive Bias Current Generator," IEEE Asian Solid-State Circuits Conference, pp. 237-240, Nov. 14-16, 2011

SUMMARY

According to an aspect of the embodiments, there is provided a quantizer that inputs an analog signal and outputs a digitized signal. The quantizer includes a shoot-through current detection unit and a feedback unit.

The shoot-through current detection unit is configured to detect a shoot-through current flowing through the quantizer. The feedback unit is configured to control a charge or a discharge of the electric charge stored at an input of the quantizer by using a feedback signal from the shoot-through current detection unit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First, before proceeding to the detailed description of the quantizer, comparator circuit, and semiconductor integrated circuit according to the present embodiments, examples of the quantizer, comparator circuit, and semiconductor integrated circuit and their associated problems will be described with reference to FIG. 1 to FIG. 6.

As described above, lithium-ion secondary batteries or the like are widely used in wireless electronic devices such as mobile phones. Such electronic devices are equipped with a circuit for generating a power-on reset (POR) signal to indicate whether a sufficient supply voltage is available or not or with a power management IC (semiconductor integrated circuit) for managing it.

The POR signal generating circuit outputs a high level "H" when a sufficient supply voltage is available, and otherwise outputs a low level "L", and it usually consist of a comparator circuit that performs voltage comparisons using a given reference voltage.

Figure 1:
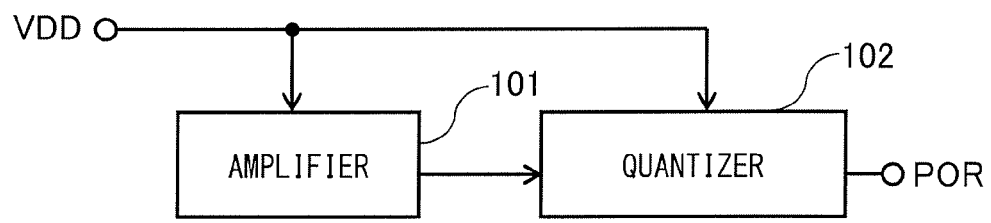
FIG. 1 is a block diagram illustrating a comparator circuit incorporated in a power management IC (semiconductor integrated circuit)
Figure 2:
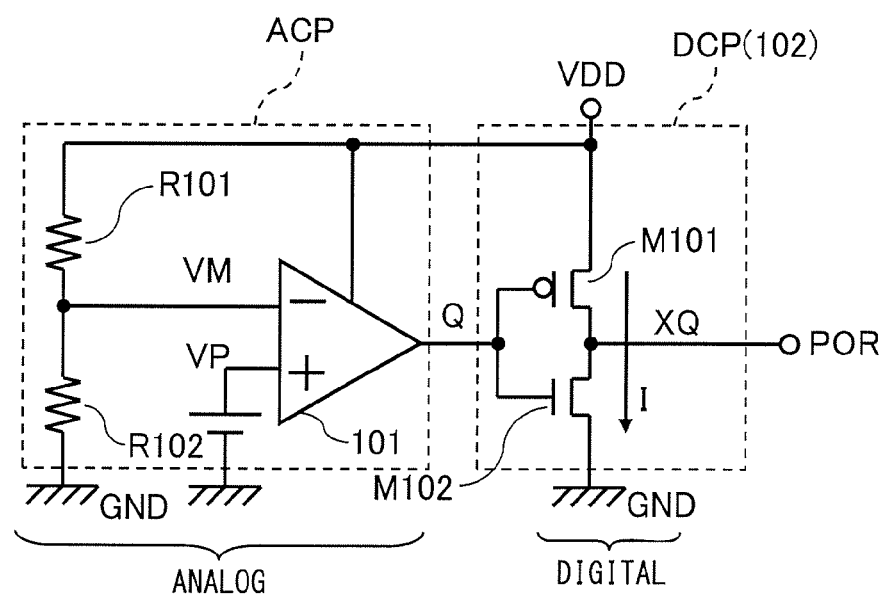
FIG. 2 is a circuit block diagram illustrating one example of the comparator circuit depicted in FIG. 1.

FIG. 1 is a block diagram illustrating a comparator circuit incorporated in a power management IC (semiconductor integrated circuit), and FIG. 2 is a circuit block diagram illustrating one example of the comparator circuit depicted in FIG. 1.

The power management IC includes, for example, a comparator circuit 100 for generating a power-on reset signal POR to indicate whether a sufficient supply voltage VDD is provided or not, and the comparator circuit 100 includes an amplifier 101 and a quantizer 102, as illustrated in FIG. 1.

As depicted in FIG. 2, in the comparator circuit 100, the difference between the reference voltage VP (reference signal) and the divided supply voltage VM (input signal) is amplified by the amplifier 101 and converted into an H/L digital signal by the quantizer 102 of the subsequent stage.

The reference voltage VP may be generated within the circuit by using a bandgap reference or the like. When the input signal voltage VM is higher than the reference voltage VP the POR signal goes to "H", from which one may see that a sufficient supply voltage VDD is provided.

As illustrated in FIG. 2, the comparator circuit 100 includes an analog circuit section ACP and a digital circuit section DCP (the quantizer 102), and the analog circuit section ACP includes resistors R101 and R102 as well as the amplifier 101.

The amplifier 101 compares the voltage VM, i.e., the divided supply voltage obtained by the resistors R101 and R102, with the reference voltage VP and produces an analog output voltage (signal Q). The quantizer 102 is an inverter which includes a pMOS transistor M101 and an nMOS transistor M102, and produces a digital output signal XQ (the POR signal) whose voltage level depends on whether the signal voltage Q exceeds the threshold value of the inverter or not.

Figure 3A:
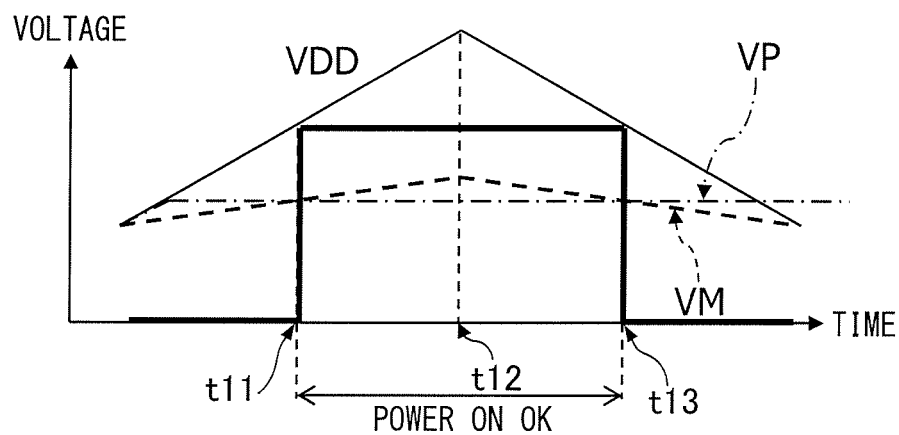
FIG. 3A and FIG. 3B are diagrams for explaining the operation of the comparator circuit depicted in FIG. 2.
Figure 3B:
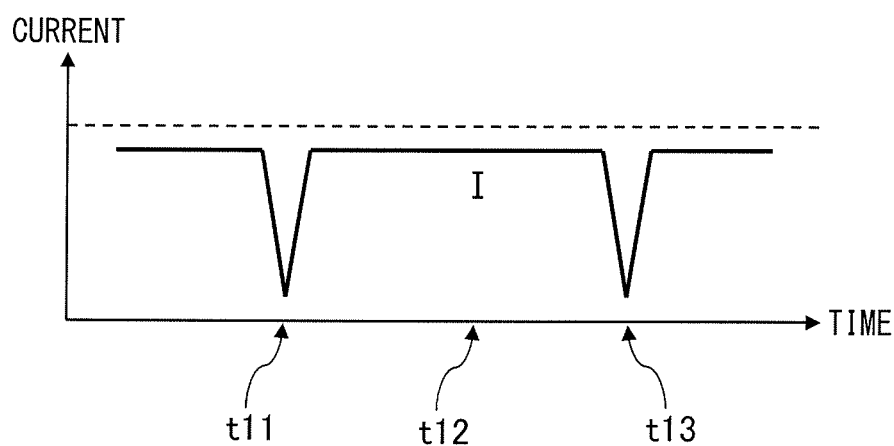

FIG. 3A and FIG. 3B are diagrams for explaining the operation of the comparator circuit depicted in FIG. 2: FIG. 3A illustrates the relationship between the divided supply voltage VM and the reference voltage VP as a function of time, and FIG. 3B illustrates the change of the current I flowing in the inverter (quantizer) 102 as a function of time.

As illustrated in FIG. 3A, the divided supply voltage VM changes with the supply voltage VDD; that is, the divided supply voltage VM increases as the time elapses and, at time t11, becomes higher than the reference voltage VP. The divided supply voltage VM continues to further increase, and changes from increasing to decreasing at time t12 and, at time t13, becomes lower than the reference voltage VP.

Accordingly, the POR signal is driven to "H" during the period from time t11 to time t13. Then, as illustrated in FIG. 3B, the current I flowing in the inverter (quantizer) 102 changes abruptly at times t11 and t13 at which the electric potential between the divided supply voltage VM and the reference voltage VP is inverted.

That is, at times t11 and t13 at which the electric potential between VM and VP is inverted and the inversion of the POR signal occurs, the output-analog signal Q of the amplifier 101 is driven to an intermediate voltage level and, as a result, a shoot-through current I flows through the quantizer 102, thus consuming a large amount of current.

Here, if the duration of the shoot-through current I is very short, or if the amount of electric charge stored at the power supply (VDD) is very large (the stored power resource is sufficient), the comparator circuit depicted in FIG. 2 may operate without any problem.

On the other hand, if the amount of electric charge stored at the power supply VDD is very small (the stored power resource is limited), for example, if the circuit is applied to a micropower supply system such as an energy harvesting system, a problem may occur.

Figure 4:
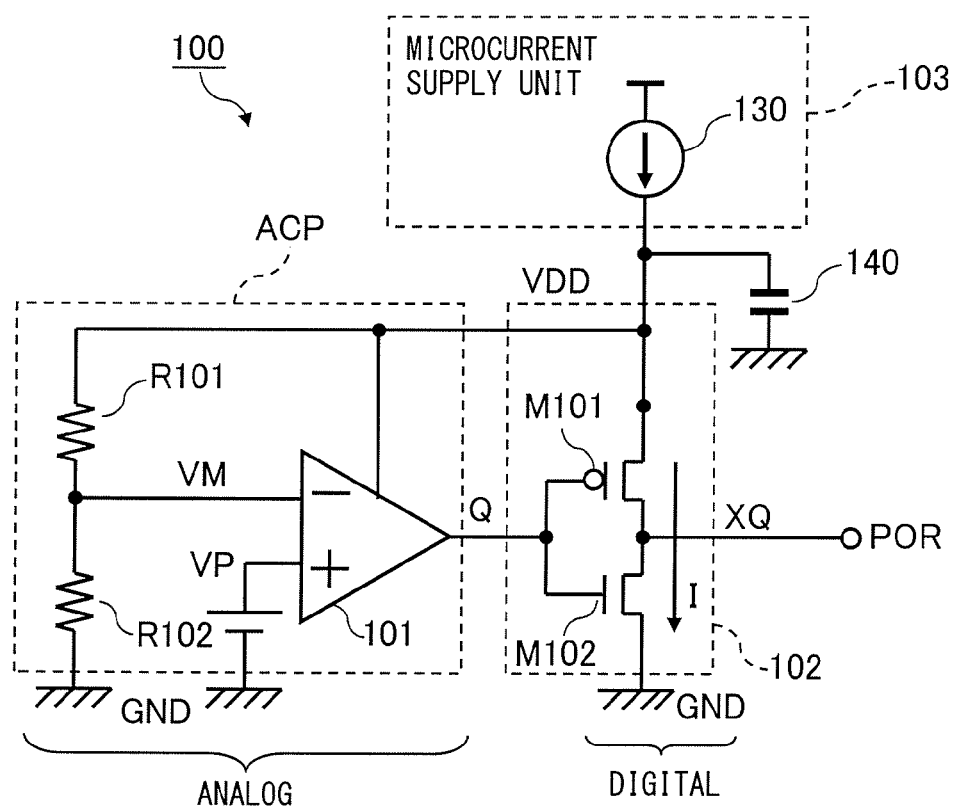
FIG. 4 is a diagram illustrating one example of a comparator circuit applied to a micropower supply system.
Figure 5A:
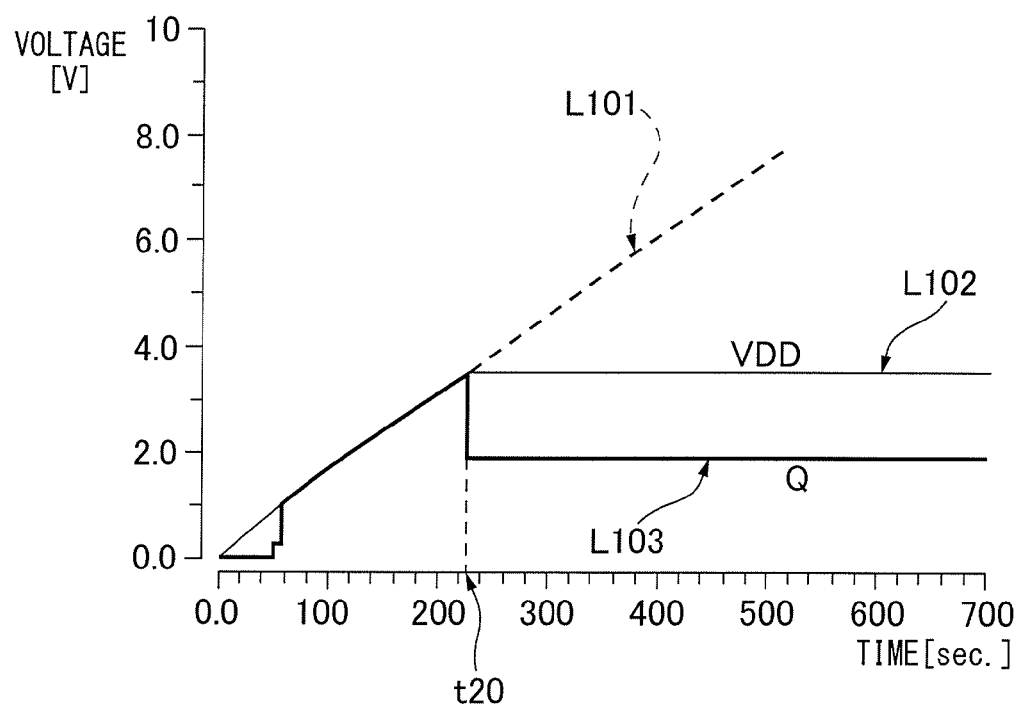
FIG. 5A and FIG. 5B are diagrams for explaining the problem associated with the comparator circuit depicted in FIG. 4.
Figure 5B:
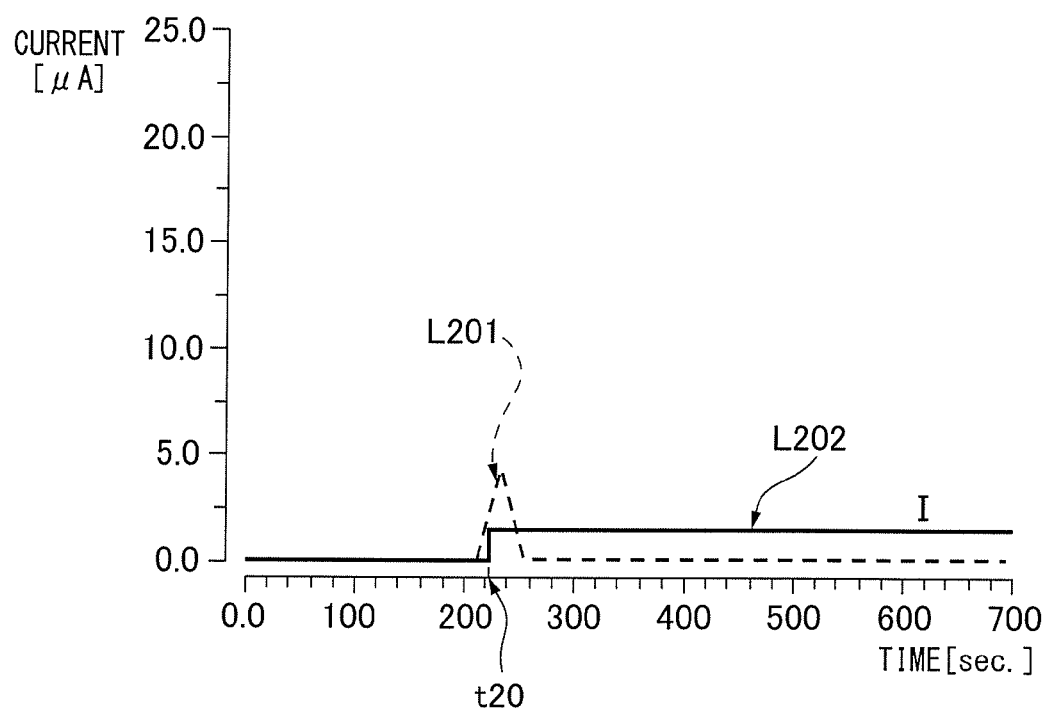

FIG. 4 is a diagram illustrating one example of a comparator circuit applied to a micropower supply system, and FIG. 5A and FIG. 5B are diagrams for explaining the problem associated with the comparator circuit depicted in FIG. 4. In FIG. 5A and FIG. 5B, simulation waveforms for the comparator circuit depicted in FIG. 4 are presented along with ideal waveforms.

In FIG. 4, a microcurrent supply unit (103) indicates a limited power resource. The microcurrent supply unit 103 supplies, for example, a current of about 2 μA, and a capacitor (input capacitor) 104 has, for example, a capacitance of about 100 μF.

More specifically, in the comparator circuit depicted in FIG. 4, when the input is 2 μA, and the input capacitance is 100 μF, that is, when the supply voltage changes by gradually increasing at an input through rate of SR=20 mV/sec, the simulation waveforms change as depicted in FIG. 5A and FIG. 5B.

In FIG. 5A, the supply voltage VDD and the output signal Q of the amplifier 101 are plotted as a function of time, and in FIG. 5B, the shoot-through current I flowing through the quantizer 102 is plotted as a function of time.

In FIG. 5A, dashed line L101 indicates the change of an ideal supply voltage, while solid line L102 indicates the change of the supply voltage VDD in the comparator circuit of FIG. 4, and L103 indicates the change of the output signal Q of the amplifier 101. In FIG. 5B, dashed line L201 indicates the change of the shoot-through current flowing through an ideal quantizer, while solid line L202 indicates the change of the shoot-through current I flowing through the comparator circuit (quantizer 102) of FIG. 4.

As illustrated in FIG. 5A, when the comparator circuit of FIG. 4 is applied to a power supply with a limited resource, the supply voltage VDD does not continue to rise as indicated by the line L101 for the case of the ideal supply voltage, but is held at a constant level, for example, after time t20. As a result, the output signal Q of the amplifier 101 operating with the supply voltage VDD is also held at a constant level after time t20.

At this time, as illustrated in FIG. 5B, the shoot-through current I flowing through the quantizer 102 does not change as indicated by the ideal curve L201, but continues to flow at a constant level after time t20.

That is, when the electric potential between VM and VP is inverted, a shoot-through current occurs but, in the case of a power supply with a limited power resource, the stored electric charge is discharged through the path of the shoot-through current, resulting in an inability to provide a sufficient amount of electric charge for the inversion to occur. As a result, the supply voltage VDD is driven to an analog intermediate level, and steady-state current flows through the quantizer 102 which is thus put in an equilibrium state.

As a result, the comparator circuit of FIG. 4 is balanced to the voltage that is determined, for example, by the input current 2 μA, and the supply voltage VDD, the output signal Q of the amplifier 101, etc. are each held at a constant intermediate voltage level.

Figure 6:
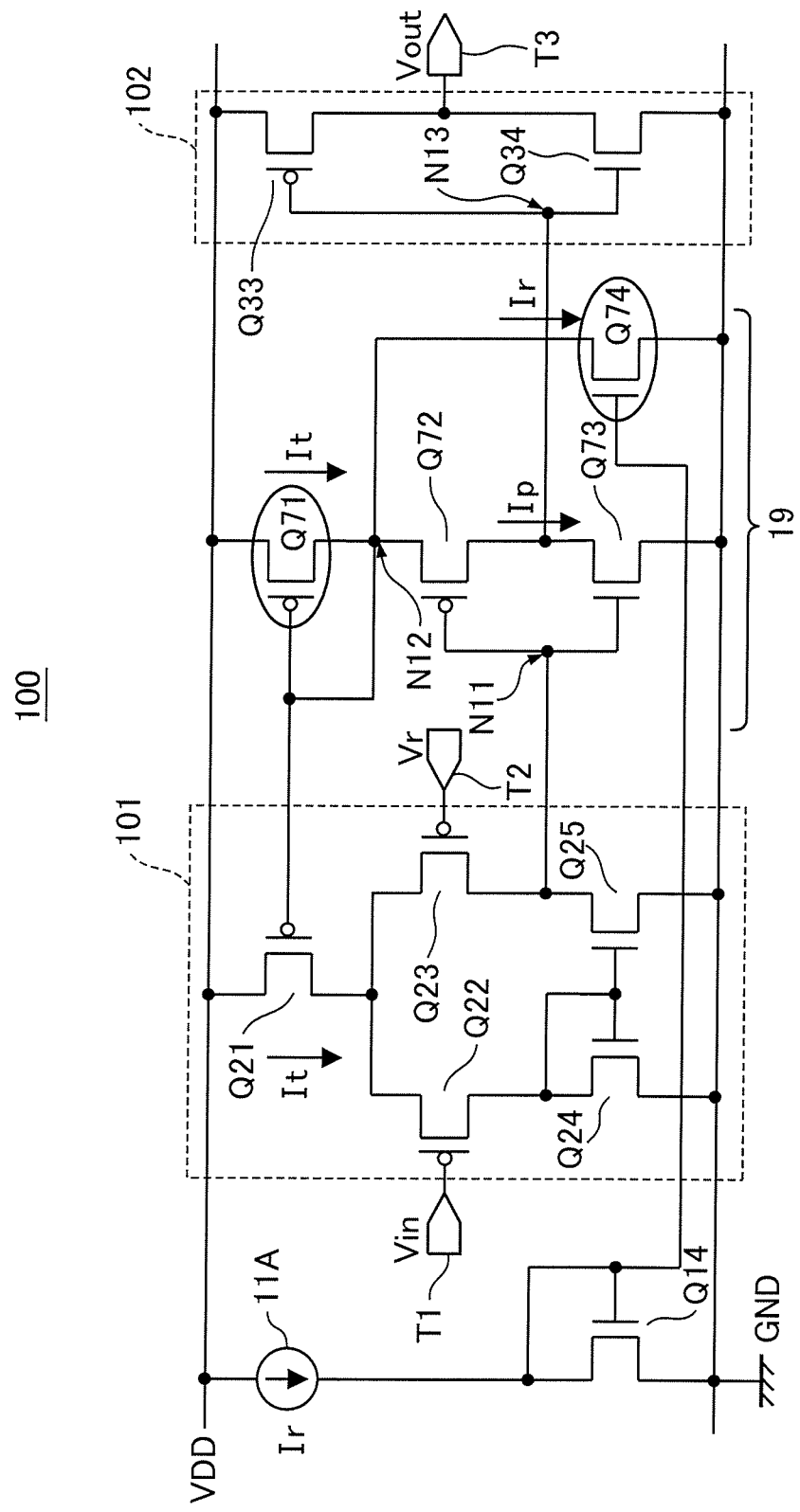
FIG. 6 is a circuit diagram illustrating one example of a prior art comparator circuit.

FIG. 6 is a circuit diagram illustrating one example of a prior art comparator circuit which is proposed to solve the above problem. In the comparator circuit illustrated in FIG. 6, when the occurrence of a shoot-through current is detected, a current corresponding to the shoot-through current is fed back to the tail current of the amplifier to speed up the amplifier operation.

In FIG. 6, Ir is a current source (11A), Q21 to Q23, Q33, Q71, and Q72 are pMOS transistors, and Q14, Q24, Q25, Q34, Q73, and Q74 are nMOS transistors.

In normal operation, the tail current It of the amplifier 101 is controlled by the transistor Q74 and the transistor Q71 connected to the transistor Q21 in a current-mirror configuration.

That is, when the output voltage of the amplifier 101 (the voltage at node N11) is driven to an intermediate level, and a shoot-through current Ip occurs in the transistors Q72 and Q73, the current It flowing through the transistor Q71 increases, and this current It is fed back as the tail current It of the amplifier 101.

This increases the driving capability of the amplifier 101, making it possible to change the voltage at node N11 to a high level "H" or low level "L" at high speed, which serves to reduce the effect of the shoot-through current that occurs when the input voltage level inverts.

However, in the above prior art comparator circuit depicted in FIG. 6, since the tail current that flows in the transistors Q71 and Q74 is used in addition of that of the amplifier 101, the current consumption increases correspondingly.

Furthermore, when the node N11 is "L", since the transistor Q72 is turned on, the input (node N13) of the quantizer 102 is held at the biasing intermediate voltage level (the voltage at node N12). As a result, a steady-state current flows through the quantizer 102, increasing the current consumption.

Figure 7:
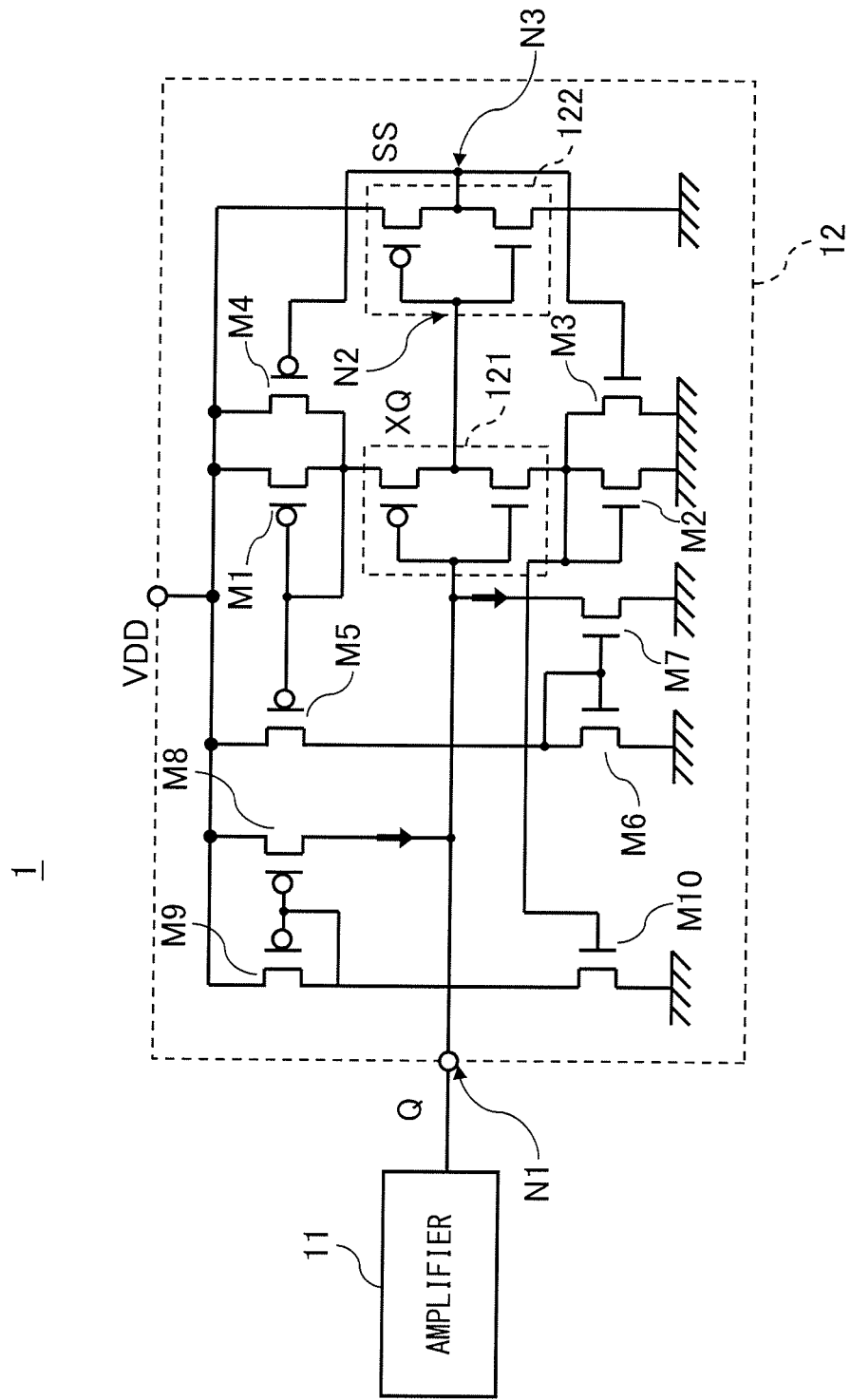
FIG. 7 is a circuit diagram illustrating a comparator circuit (quantizer) according to a first embodiment.

The quantizer, comparator circuit, and semiconductor integrated circuit according to the embodiments of the invention will now be described in detail below with reference to the accompanying drawings. FIG. 7 is a circuit diagram illustrating the quantizer (comparator circuit) of the first embodiment.

The following description will be given by focusing primarily on the comparator circuit, but the quantizer of the present embodiment is not limited in its application to a comparator circuit having an amplifier and a quantizer, but may be applied to various circuits that take an analog signal as input and produce a quantized signal for output.

As illustrated in FIG. 7, the comparator circuit 1 includes an amplifier 11 and a quantizer 12. The quantizer 12 includes two stages of inverters 121 and 122 connected to an output (Q) of the amplifier 11, and transistors M1 and M2 for detecting the occurrence of a shoot-through current between the inverter (first inverter) 121 and the power supply and ground, respectively.

The quantizer 12 further includes switches M3 and M4 which control the detection operation of the transistors M1 and M2 in response to an output signal SS of the inverter (second inverter) 122, and a current-mirror circuit, M5 to M10, which feeds back the occurrence of a shoot-through current to the input of the inverter 121.

The pair of transistors M1 and M2 corresponds to a shoot-through current detection unit, that is, the transistor M1 corresponds to a first shoot-through current detection element, and the transistor M2 corresponds to a second shoot-through current detection element. On the other hand, the transistor M4 corresponds to a first switch element, and the transistor M3 corresponds to a second switch element.

Further, the current-mirror circuit, M5 to M10, corresponds to a feedback unit, that is, the transistors M5 to M7 correspond to a first feedback element array, and the transistors M8 to M10 correspond to a second feedback element array.

Figure 8A:
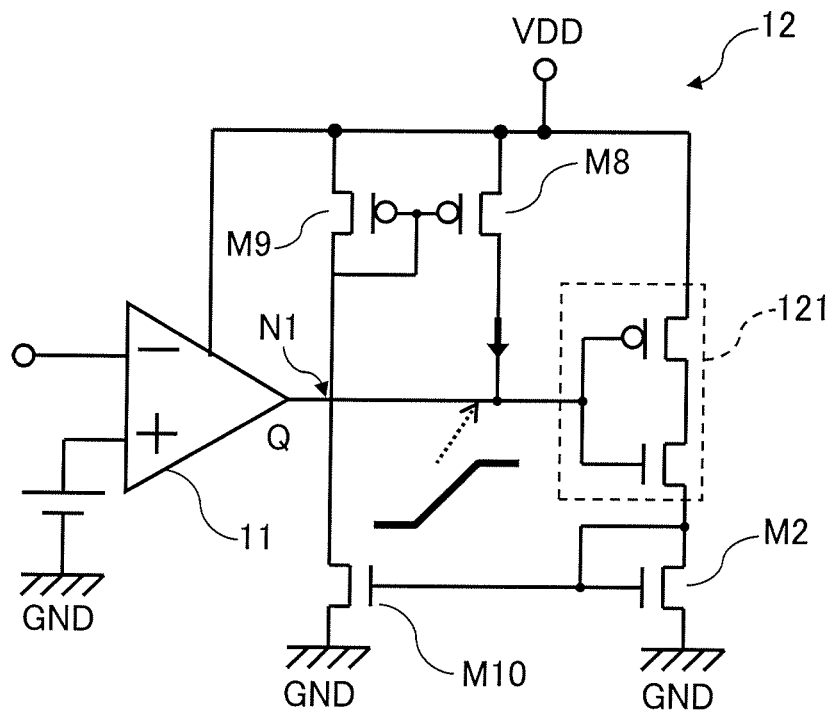
FIG. 8A and FIG. 8B are diagrams (part 1) for explaining the operation of the comparator circuit depicted in FIG. 7.
Figure 8B:
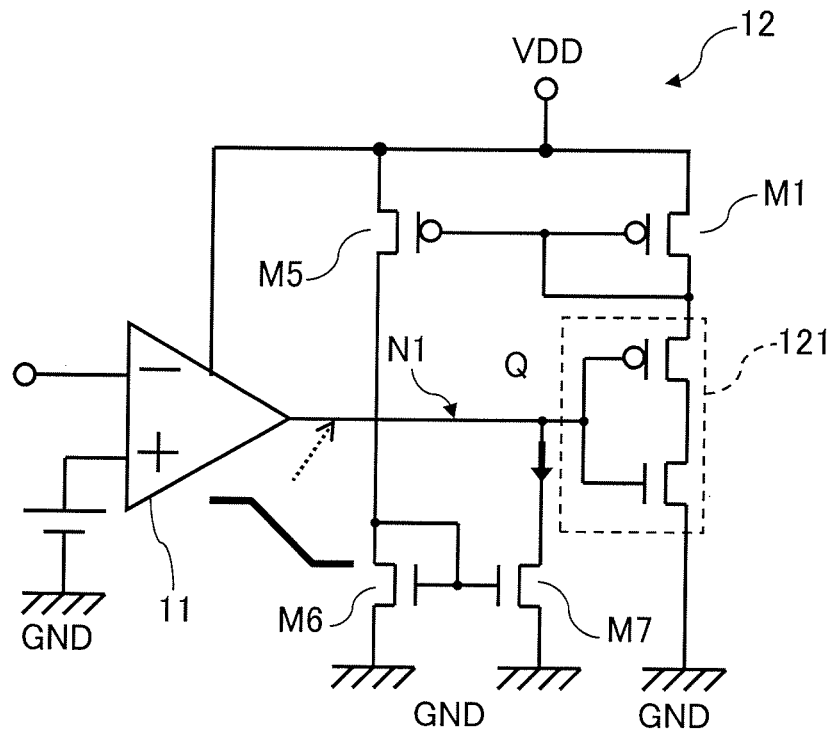
Figure 9A:
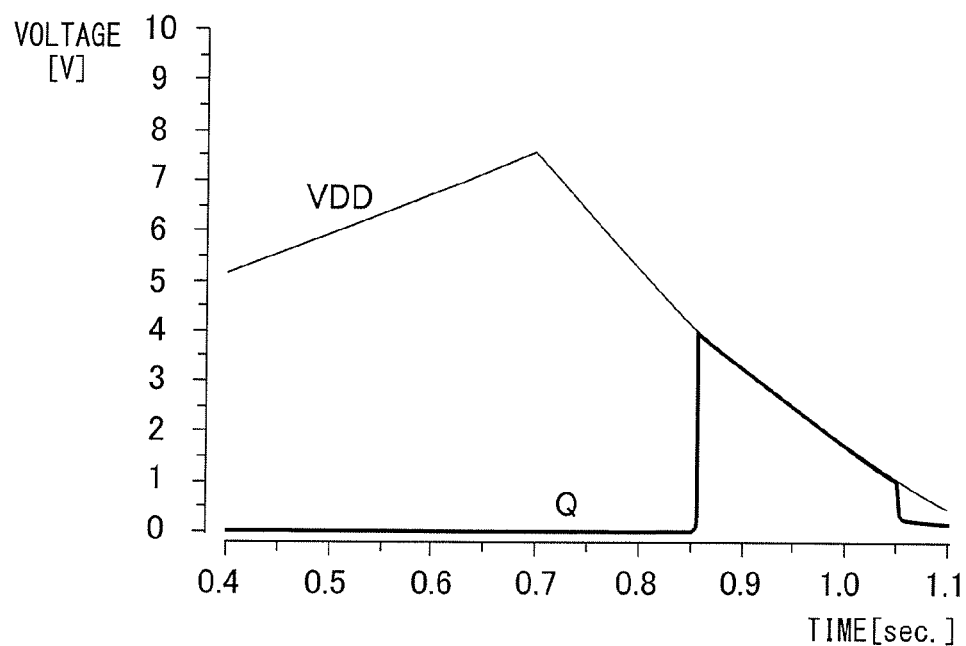
FIG. 9A and FIG. 9B are diagrams (part 2) for explaining the operation of the comparator circuit depicted in FIG. 7.
Figure 9B:
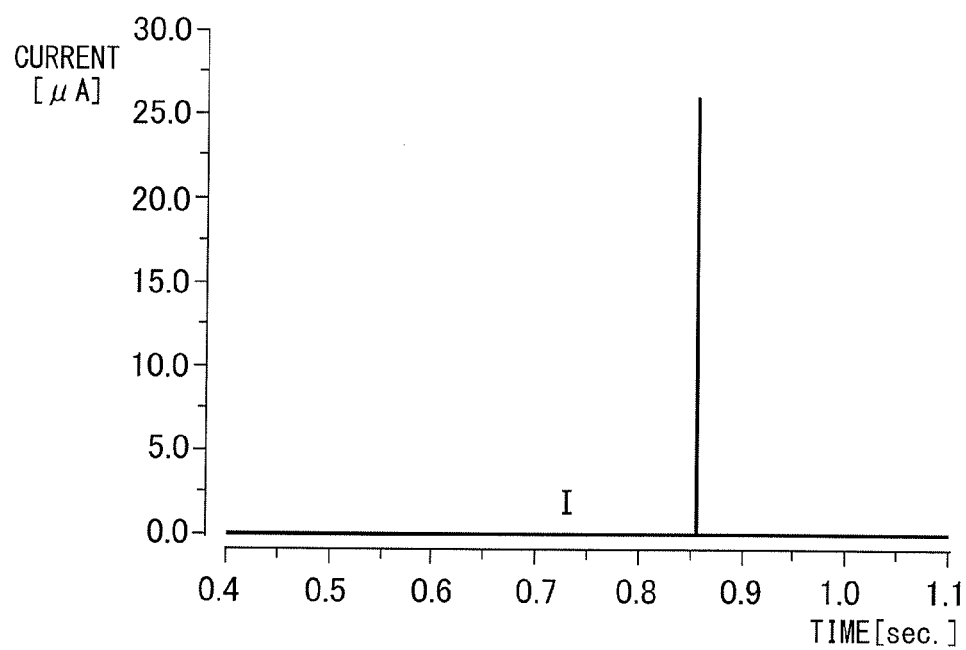
Figure 10A:
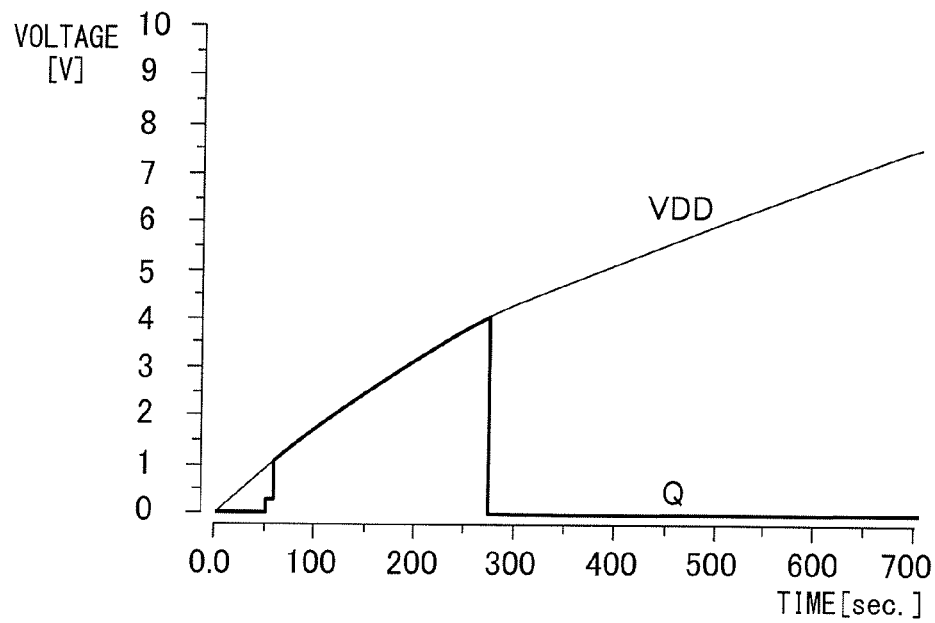
FIG. 10A and FIG. 10B are diagrams (part 3) for explaining the operation of the comparator circuit depicted in FIG. 7.
Figure 10B:
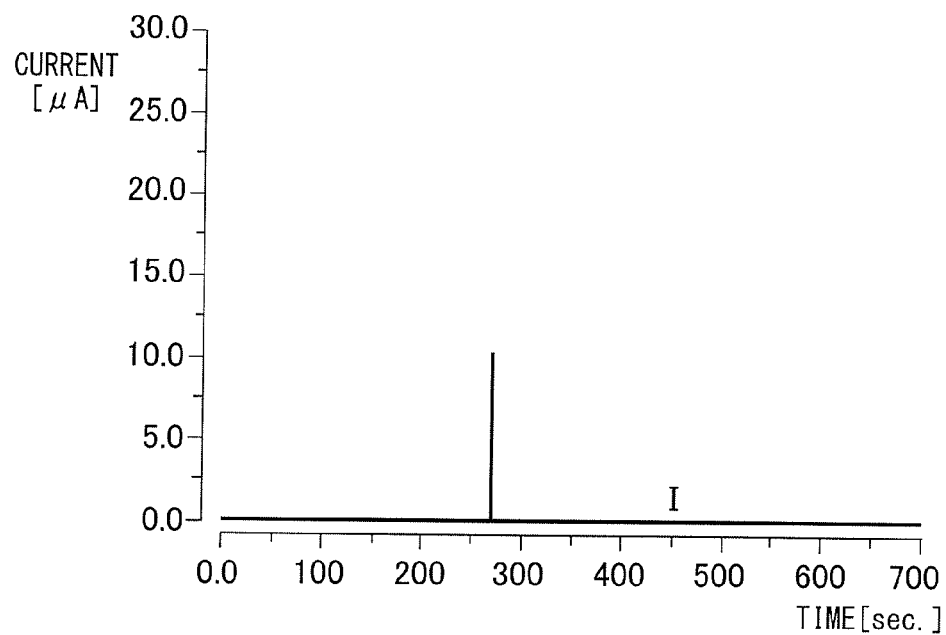

FIG. 8A to FIG. 10B are diagrams for explaining the operation of the comparator circuit depicted in FIG. 7. More specifically, FIGS. 8A, 9A and 9B are diagrams for explaining the operation when the output signal Q of the amplifier 11 rises, and FIGS. 8B, 10A and 10B are diagrams for explaining the operation when the output signal Q of the amplifier 11 falls.

As illustrated in FIG. 8A, before the output signal Q of the amplifier 11 rises, the voltage Q (the voltage at node N1) is held at "L". Accordingly, the output SS of the inverter 122 (the voltage at node N3 in FIG. 7) is also held at "L".

As a result, the switch (nMOS transistor) M3 is turned off, the switch (pMOS transistor) M4 is turned on, and the inverter 121 is connected to ground (GND) via the transistor M2 and connected directly to the power supply (supply voltage VDD).

When the switch M4 is turned on, the transistor M1 becomes unable to detect the occurrence of a shoot-through current; as a result, the transistors M5 to M7 do not operate, and the quantizer 12 is put in a condition in which only the transistors M2 and M8 to M10 may operate, as illustrated in FIG. 8A.

That is, as illustrated in FIG. 8A and FIG. 9A, when the signal Q rises and reaches an intermediate voltage level, a shoot-through current (second shoot-through current) begins to flow through the inverter 121. At this time, the shoot-through current detected by the transistor M2 is mirrored to the transistors M10, M9, and M8 in this order, thus applying feedback so as to charge the node N1 (the signal Q).

This boost operation accelerates the voltage rise at the node N1 (the signal Q), as depicted in FIG. 9A and FIG. 9B. Then, the shoot-through current being detected by the transistor M2 gradually decreases as the voltage level of the signal Q rises, and when the signal Q changes from "L" to "H", the shoot-through current becomes zero, and no current flows into the current mirror circuit of the transistors M8 to M10.

On the other hand, when the voltage at the node N3 (the output SS) rises to "H" after the voltage at the node N1 (the signal Q) has made a transition to "H", the switch M3 is turned on, and the switch M4 is turned off. At this time, the inverter 121 is connected to the power supply (VDD) via the transistor M1 and connected directly to ground (GND).

When the switch M3 is turned on, the transistor M2 becomes unable to detect the occurrence of a shoot-through current; as a result, the transistors M8 to M10 do not operate, and the quantizer 12 is put in a condition in which only the transistors M1 and M5 to M7 may operate, as illustrated in FIG. 8B.

That is, as illustrated in FIG. 8B and FIG. 10A, when the signal Q falls and reaches an intermediate voltage level, a shoot-through current (first shoot-through current) begins to flow through the inverter 121. At this time, the shoot-through current detected by the transistor M1 is mirrored to the transistors M5, M6, and M7 in this order, thus applying feedback so as to discharge the node N1 (the signal Q).

This boost operation accelerates the voltage fall at the node N1 (the signal Q), as depicted in FIG. 10A and FIG. 10B. Then, the shoot-through current being detected by the transistor M1 gradually decreases as the voltage level of the signal Q falls, and when the signal Q changes from "H" to "L", the shoot-through current becomes zero, and no current flows into the current mirror circuit of the transistors M5 to M7.

As described above, by appropriate switching the circuit to be used from one to the other at the time of the rising and falling of the output signal Q of the amplifier 11, and by boosting and accelerating the charge/discharge action of the input signal (Q) of the quantizer 12, the speed of operation at the time of the occurrence of a shoot-through current may be increased.

When a shoot-through current occurs, the current consumption increases due to the current mirror action, but since the voltage level of the input signal (Q) of the quantizer 12 instantly changes and feedback is applied in the direction that decreases the shoot-through current, the time during which the current consumption increases may be reduced.

Further, the size of each transistor in the quantizer 12 may be suitably selected so that the amount of electric charge which is charged and discharged by the shoot-through current of the inverter 121 and the current mirror action does not exceed the amount of electric charge stored at the power supply VDD.

As illustrated in FIG. 9A, FIG. 9B, FIG. 10A and FIG. 10B, according to the comparator circuit of the first embodiment, even when the circuit is applied to a power supply with a limited power resource, the signal Q (the node N1) instantly changes to "H" or "L" at the change point and does not stay at the intermediate voltage level.

In this way, according to the comparator circuit of the first embodiment, since the input node N1 of the quantizer 12 is charged or discharged so as to accelerate the state transition using detection of the occurrence of a shoot-through current, each node in the quantizer quickly makes a transition without staying at the intermediate voltage level.

This prevents the shoot-through current from flowing in a steady-state manner at the time of the rising or falling of the supply voltage VDD, and it thus becomes possible to provide a comparator circuit that may perform accurate operations with low current consumption.

The advantageous effect described above is not limited to the comparator circuit of the first embodiment, but may also be achieved with the comparator circuit of any of the second to fifth embodiments described hereinafter. Further, the comparator circuit of the present embodiments may be extensively applied to semiconductor integrated circuits, including, for example, a power management IC or a circuit for indicating whether a sufficient supply voltage is available or not.

Figure 11:
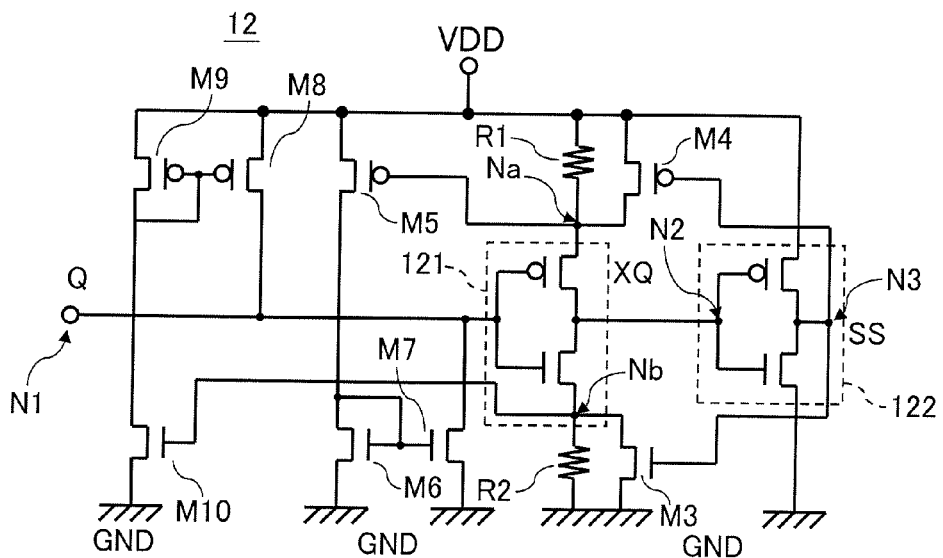
FIG. 11 is a circuit diagram illustrating a quantizer according to a second embodiment.

FIG. 11 is a circuit diagram illustrating the quantizer of the second embodiment. As is apparent from a comparison between FIG. 11 and FIG. 7, the quantizer of the second embodiment differs from the comparator circuit (quantizer) of the first embodiment depicted in FIG. 7 in that the transistors M1 and M2 for detecting the occurrence of a shoot-through current in the inverter 121 are replaced by resistors R1 and R2.

According to the quantizer of the second embodiment, since the amount of shoot-through current may be limited by the resistance value of the resistors R1 and R2, this embodiment is suitable, for example, when designing the circuit by limiting the peak of the shoot-through current.

More specifically, when VDD=2V, and when it is desired to limit the shoot-through current to 1 mA or less, for example, the resistors R1 and R2 may be chosen to have a resistance value of 2 kΩ. In this case, when a shoot-through current of 1 mA flows, if the switch M3 is ON, the node Na instantly changes from 2 V to nearly 0 V, and if the switch M4 is ON, the node Nb instantly changes from 0 V to nearly 2 V.

In this way, according to the quantizer (comparator circuit) of the second embodiment, since the time for instantly stopping the shoot-through current of the inverter 121 may be set, the peak of the shoot-through current may be limited by the resistance value.

The occurrence of the shoot-through current may be detected by detecting the voltage fall at the node Na or the voltage rise at the node Nb; then, by feeding back this voltage change to the node N1 through the current mirror identical to that of the first embodiment, it becomes possible to accelerate the boost operation of the change.

Figure 12:
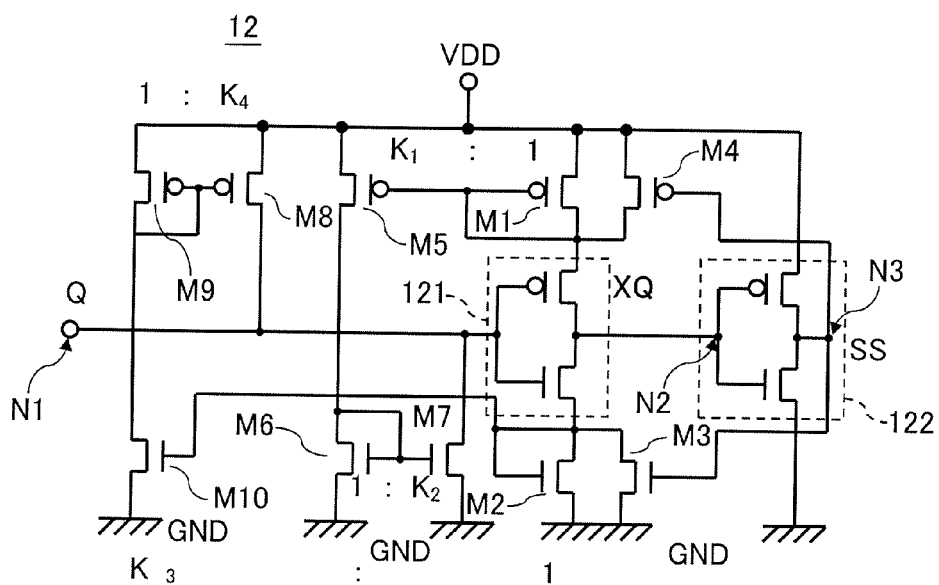
FIG. 12 is a circuit diagram illustrating a quantizer according to a third embodiment.

FIG. 12 is a circuit diagram illustrating the quantizer of the third embodiment. As is apparent from a comparison between FIG. 12 and FIG. 7, the quantizer of the third embodiment differs from the comparator circuit (quantizer) of the first embodiment depicted in FIG. 7 in that the transistor size of each of the current mirror is adjusted to change the current mirror ratio and thereby control the amount of electric charge to be charged and discharged at the node N1.

For example, assume that among the transistors M1 and M5 to M7 in FIG. 8B, the size (gate width) of the transistors M1 and M5 is set at $1:K_1$ and the size of the transistors M6 and M7 is set at $1:K_2$. In this case, the amount of electric charge which is discharged from the transistor M7 is $K_1 \times K_2$ times the amount of electric charge obtained at the transistor M1.

On the other hand, assume that among the transistors M2 and M8 to M10 in FIG. 8A, the size of the transistors M2 and M10 is set at $1:K_3$ and the size of the transistors M9 and M8 is set at $1:K_4$. In this case, the amount of electric charge which is charged from the transistor M8 is $K_3 \times K_4$ times the amount of electric charge obtained at the transistor M2.

If the constants $K_1$ to $K_4$ which define the mirror ratios of the respective transistors are all set to 1 or larger, the amount of electric charge which is charged and discharged at the node N1 may be increased, and thus the speed of the boost operation may be further enhanced. In practice, however, since the amount of electric charge which is charged and discharged is limited by the power supply capacity (VDD), the mirror ratio constants $K_1$ to $K_4$ are set by considering the operating speed and the amount of electric charge that may be used.

Figure 13:
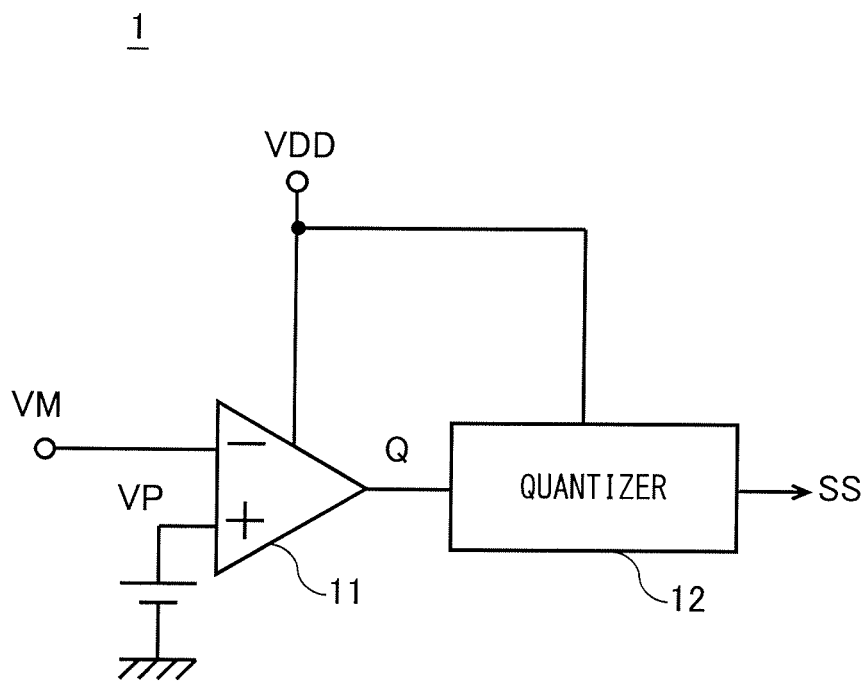
FIG. 13 is a circuit diagram illustrating a comparator circuit (quantizer) according to a fourth embodiment.

FIG. 13 is a circuit diagram illustrating the comparator circuit (quantizer) of the fourth embodiment. As illustrated in FIG. 13, the comparator circuit includes an amplifier 11 and a quantizer 12. The difference between the reference voltage VP and the divided voltage VM obtained by dividing the supply voltage (VDD) is amplified by the amplifier 11, and the output signal Q of this amplifier 11 is converted into an H/L digital signal by the quantizer 12 at the subsequent stage.

The reference voltage VP may be generated, for example, by an analog reference voltage generating circuit such as a bandgap reference or by a voltage dividing resistor ladder inserted between the power supply VDD and ground GND. In this way, by using the amplifier 11, a minuscule analog potential difference (VP−VM) may be amplified for conversion into a digital value.

Figure 14:
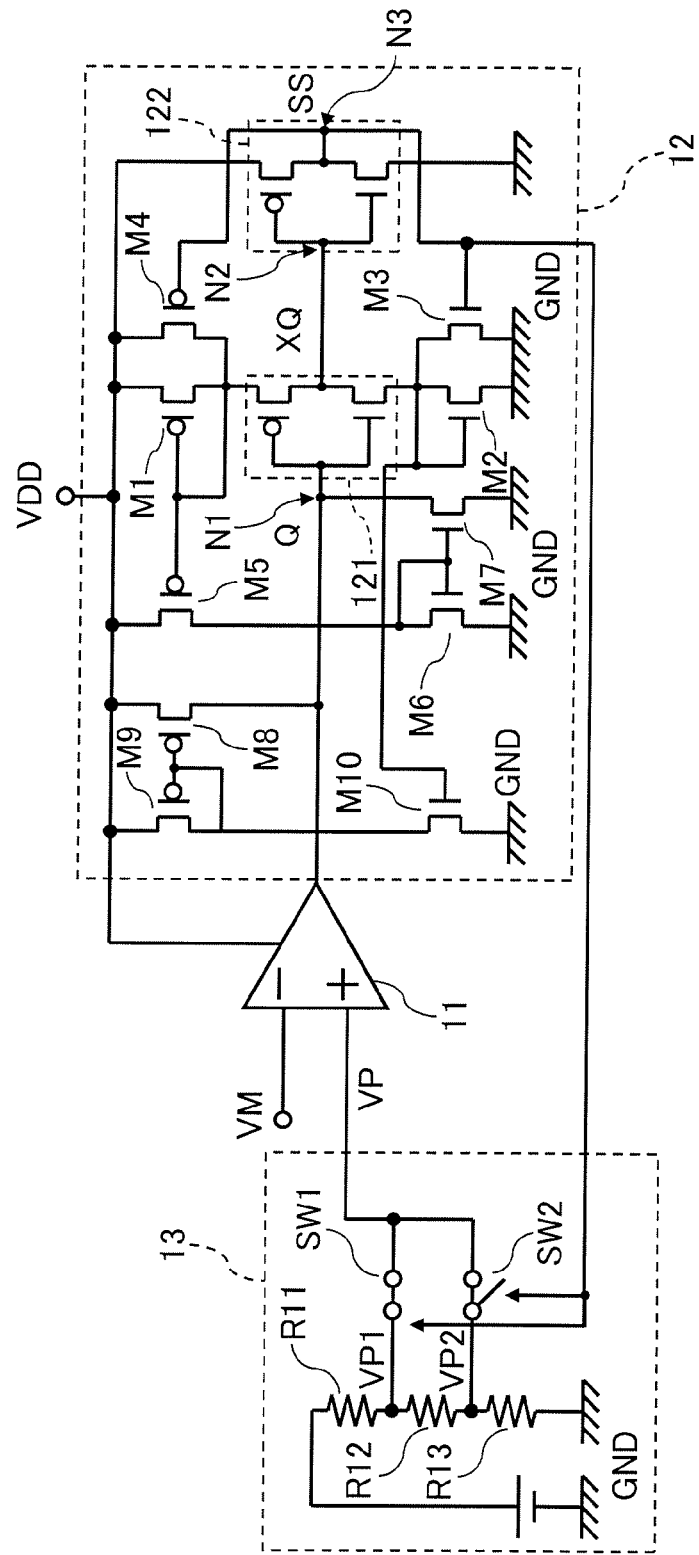
FIG. 14 is a circuit diagram illustrating a comparator circuit (quantizer) according to a fifth embodiment.
Figure 15:
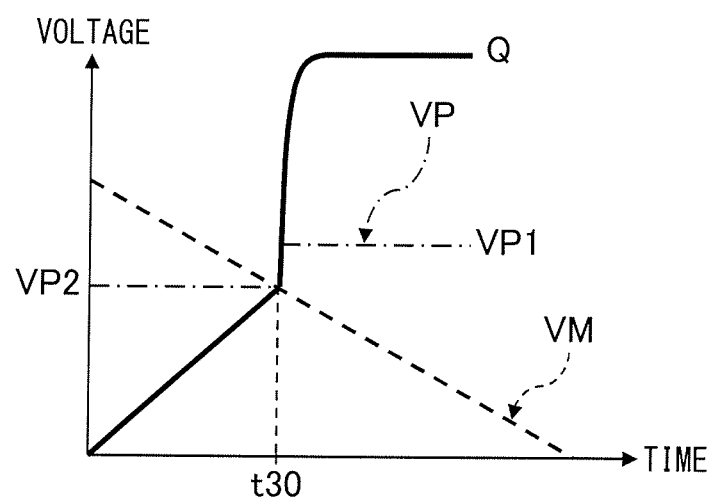
FIG. 15 is a diagram for explaining the operation of the comparator circuit depicted in FIG. 14.

FIG. 14 is a circuit diagram illustrating the comparator circuit (quantizer) of the fifth embodiment, and FIG. 15 is a diagram for explaining the operation of the comparator circuit depicted in FIG. 14. In FIG. 14, the circuit connected with the input of the amplifier 11 (VP) is a hysteresis generating circuit 13.

As is apparent from a comparison between FIG. 14 and FIG. 7, the comparator circuit of the fifth embodiment differs from the comparator circuit of the first embodiment depicted in FIG. 7 by the inclusion of the hysteresis generating circuit 13. The hysteresis generating circuit 13 includes three resistors R11 to R13 connected in series, and switches SW1 and SW2 for taking reference voltages VP1 and VP2 from the connection node between the resistors R11 and R12 and the connection node between the resistors R12 and R13, respectively.

The hysteresis generating circuit 13 selects one of the two different reference voltages VP1 and VP2 in accordance with the output signal SS of the inverter 122, and outputs the selected one. That is, in the comparator circuit of the fifth embodiment depicted in FIG. 14, the input to the amplifier 11 is switched between the two reference voltages VP1 and VP2 in accordance with the output signal SS of the quantizer 12.

More specifically, as depicted in FIG. 15, when VM>VP, the output SS is at "L"; therefore, the switch SW2 is turned on and the switch SW1 turned off, and the lower reference voltage VP2 is selected as the reference voltage VP for input to the amplifier 11.

Then, the voltage VM gradually decreases and reaches VP at time t30, whereupon a shoot-through current flows through the quantizer 12, and the voltage level of the signal Q is quickly raised to "H" because of the voltage charged from the power supply (VDD).

At this time, since the output SS changes to "H", the switch SW1 is turned on and the switch SW2 turned off, and the higher reference voltage VP1 is selected as the reference voltage VP for input to the amplifier 11.

In this way, when the input signal voltage VM gradually decreases and becomes equal to the reference voltage VP (at time t30), VP is switched to the higher one to increase the difference between VM and VP, thereby preventing the occurrence of chattering and thus stabilizing the operation of the comparator circuit 1.

Chattering is a phenomenon in which when the signal voltage Q changes, the voltage level of node N1 repeats state transition ("H" to "L" and "L" to "H") during a certain time, because the input change of the amplifier 11 is slow and the amplifier 11 tries to bring the state of the node N1 back to its previous state, even if the node N1 is charged or discharged by the current mirror.

That is, in the comparator circuit of the fifth embodiment, in order to prevent the occurrence of chattering, feedback control generally known as hysteresis control is employed that applies a voltage change to the input of the amplifier 11 so as to accelerate the change when the change point is reached. This serves to stabilize the operation of the quantizer 12. In the present embodiment, hysteresis may be provided to the input signal voltage VM, not to the reference voltage VP.

As described above, by detecting the shoot-through current flowing through the quantizer in the comparator circuit, and by feeding back the information to adjust the voltage level at the input terminal of the quantizer, the comparator circuit according to each of the above embodiments may accomplish a transition from one binary value to the other at high speed and may thus reduce the power consumption.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A quantizer that takes an analog signal as input and produces a quantized signal for output, comprising:
    a first inverter;
    a first shoot-through current detector configured to detect a first shoot-through current that flows through the first inverter when the quantized signal makes a transition to a first value;
    a second shoot-through current detector configured to detect a second shoot-through current that flows through the first inverter when the quantized signal makes a transition to a second value; and
    a feedback unit configured to control an electric charge stored at an input of the quantizer on the basis of the first shoot-through current or the second shoot-through current.

2. The quantizer according to claim 1, wherein the first shoot-through current detector is provided between a first power supply line and the first inverter, and the second shoot-through current detector is provided between the first inverter and a second power supply line.

3. The quantizer according to claim 2, wherein the feedback unit includes:
    a first feedback element array configured by a current-mirror circuit which copies the first shoot-through current detected by the first shoot-through current detector; and
    a second feedback element array configured by a current-mirror circuit which copies the second shoot-through current detected by the second shoot-through current detector.

4. The quantizer according to claim 3, wherein the first feedback element array discharges an electric charge corresponding to the first shoot-through current detected by the first shoot-through current detector from the input of the quantizer, and
    the second feedback element array charges an electric charge corresponding to the second shoot-through current detected by the second shoot-through current detector to the input of the quantizer.

5. The quantizer according to claim 3, wherein the first feedback element array discharges an electric charge larger than a charge corresponding to the first shoot-through current detected by the first shoot-through current detector from the input of the quantizer, and
    the second feedback element array charges an electric charge larger than a charge corresponding to the second shoot-through current detected by the second shoot-through current detector to the input of the quantizer.

6. The quantizer according to claim 5, wherein the first shoot-through current detection element and the first feedback element array are adjusted by transistor sizes to control a current mirror ratio, and
    the second shoot-through current detection element and the second feedback element array are adjusted by transistor sizes to control a current mirror ratio.

7. The quantizer according to claim 3, the quantizer further comprising a second inverter connected to an output of the first inverter, wherein the second inverter outputs the quantized signal by inverting the output of the first inverter.

8. The quantizer according to claim 7, the quantizer further comprising:
    a first switch element that is provided in parallel with the first shoot-through current detector and controlled by the quantized signal; and
    a second switch element that is provided in parallel with the second shoot-through current detector and controlled by the quantized signal.

9. The quantizer according to claim 8, wherein the first feedback element array discharges the input electric charge of the first inverter when the first shoot-through current detector has detected the first shoot-through current with the first switch element turned off and the second switch element turned on, and the second feedback element array charges the input electric charge of the first inverter when the second shoot-through current detector has detected the second shoot-through current with the first switch element turned on and the second switch element turned off.

10. A comparator circuit comprising:

an amplifier configured to amplify a difference between a level of an input signal and a level of a reference signal; and a quantizer configured to take an analog output signal of the amplifier as input and produce a quantized signal for output, wherein the quantizer includes:

a first inverter;

a first shoot-through current detector configured to detect a first shoot-through current that flows through the first inverter when the quantized signal makes a transition to a first value;

a second shoot-through current detector configured to detect a second shoot-through current that flows through the first inverter when the quantized signal makes a transition to a second value; and a feedback unit configured to control an electric charge stored at an input of the quantizer on the basis of the first shoot-through current or the second shoot-through current.

11. The comparator circuit according to claim 10, the comparator circuit further comprising a hysteresis generating unit configured to control the level of at least one of the input signal and the reference signal so as to increase the difference between the level of the input signal and the level of the reference signal in accordance with the quantized signal.

12. A semiconductor integrated circuit including a comparator circuit, wherein the comparator circuit comprising:

an amplifier configured to amplify a difference between a level of an input signal and a level of a reference signal; and a quantizer configured to take an analog output signal of the amplifier as input and produce a quantized signal for output, wherein the quantizer includes:

a first inverter;

a first shoot-through current detector configured to detect a first shoot-through current that flows through the first inverter when the quantized signal makes a transition to a first value;

a second shoot-through current detector configured to detect a second shoot-through current that flows through the first inverter when the quantized signal makes a transition to a second value; and a feedback unit configured to control an electric charge stored at an input of the quantizer on the basis of the first shoot-through current or the second shoot-through current, and wherein the comparator circuit outputs the quantized signal when the level of the input signal is higher than the level of the reference signal.

13. The semiconductor integrated circuit according to claim 12, wherein the input signal is derived from an output of a micropower supply, and the semiconductor integrated circuit is a power management semiconductor integrated circuit configured to output the quantized signal as a power-on reset signal when the level of the input signal is higher than the level of the reference signal.

\* \* \* \* \*